United States Patent
Jovenin et al.

(10) Patent No.: US 7,043,221 B2
(45) Date of Patent: May 9, 2006

(54) MIXER CIRCUIT WITH IMAGE FREQUENCY REJECTION, IN PARTICULAR FOR AN RF RECEIVER WITH ZERO OR LOW INTERMEDIATE FREQUENCY

(75) Inventors: Fabrice Jovenin, Caen (FR); David Canard, Caen (FR)

(73) Assignee: Stepmind, Boulogne Billancourt (FR)

( * ) Notice: Subject to any disclaimer, the term of this patent is extended or adjusted under 35 U.S.C. 154(b) by 141 days.

(21) Appl. No.: 10/486,624

(22) PCT Filed: Jul. 19, 2002

(86) PCT No.: PCT/FR02/02595

§ 371 (c)(1),
(2), (4) Date: Jun. 16, 2004

(87) PCT Pub. No.: WO03/017465

PCT Pub. Date: Feb. 27, 2003

(65) Prior Publication Data

US 2004/0214548 A1    Oct. 28, 2004

(30) Foreign Application Priority Data

Aug. 13, 2001 (FR) .................................. 01 10772

(51) Int. Cl.
*H04B 1/10* (2006.01)
(52) U.S. Cl. ............ 455/302; 455/326; 455/324; 455/209; 455/295; 375/346
(58) Field of Classification Search ............ 455/326, 455/209, 295, 296, 302, 324; 375/346
See application file for complete search history.

(56) References Cited

U.S. PATENT DOCUMENTS

| | | | |
|---|---|---|---|
| 5,410,743 A | 4/1995 | Seely | |
| 5,821,782 A | 10/1998 | Carloni | |
| 6,397,044 B1* | 5/2002 | Nash et al. | 455/73 |
| 6,516,184 B1* | 2/2003 | Damgaard et al. | 455/86 |
| 6,867,687 B1* | 3/2005 | Turner | 340/10.2 |
| 2003/0072389 A1* | 4/2003 | Li et al. | 375/308 |

FOREIGN PATENT DOCUMENTS

| | | |
|---|---|---|
| EP | 0 292 002 A | 11/1998 |
| WO | 01 15313 A | 3/2001 |

OTHER PUBLICATIONS

International Search Report for PCT/FR02/02595; ISA/EPO; Mailed: Dec. 16, 2002.

* cited by examiner

*Primary Examiner*—Duc Nguyen
*Assistant Examiner*—Tuan Pham
(74) *Attorney, Agent, or Firm*—Harness, Dickey & Pierce, P.L.C.

(57) ABSTRACT

A mixer circuit with image frequency rejection comprising a quadrature phase divider (30, 30') presenting an input connected to the input ($F_i$) of the mixer circuit and two outputs respectively delivering two signals in phase quadrature which are applied respectively to two simple mixers (31, 32; 31', 32'), said mixer circuit comprising a quadrature phase and frequency divider (33, 33') having a frequency division ratio and presenting two inputs respectively connected to the respective outputs of the two simple mixers (31, 32; 31', 32') and a first output delivering a first output signal ($F_o$) of the mixer circuit, which signal is applied to the inputs of the two simple mixers.

13 Claims, 3 Drawing Sheets

MIXER CIRCUIT WITH IMAGE FREQUENCY REJECTION, IN PARTICULAR FOR AN RF RECEIVER WITH ZERO OR LOW INTERMEDIATE FREQUENCY

The present invention relates to a mixer circuit with image frequency rejection.

It relates particularly, but not exclusively, to radio frequency (RF) receivers using an intermediate frequency (IF) that is zero or close to zero. Such receivers are used in particular in mobile telephony systems such as the global system for mobile telecommunications (GSM) or the digital communications system at 1800 megahertz (MHz) (DCS 1800) which is identical to the GSM standard but operates in a different frequency band ([1805 MHz, 1880 MHz] compared with [925 MHz, 960 MHz] for GSM). They are also used in wireless transmissions such as those defined using the following standards: 802.11 a and b, Bluetooth, Hyperlan 2, and digital European cordless telecommunications (DECT), or using the industrial scientific and medical (ISM) band at 2.4 gigahertz (GHz).

In conventional manner, such a receiver comprises a low noise amplifier (LNA) connected to the receive antenna via a bandpass filter, the amplified signal being applied to a mixer circuit for converting the amplified input signal into baseband, the mixer circuit producing two signals in quadrature (phase offset of 90°) in baseband, which signals are filtered and then applied to a demodulator.

Compared with superheterodyne receivers (i.e. having a non-zero intermediate frequency), as are also used in mobile telephony, such receivers have the advantage of not requiring an external bandpass filter based on surface acoustic wave (SAW) technology as is normally required in order to obtain a receiver that is sufficiently selective, such a filter contributing significantly to the cost, the size, and the electricity consumption of such a receiver. However, because such receivers operate in baseband, they are sensitive to direct current (DC) voltages generated by leakage currents that occur in particular between the local oscillator of the mixer circuit operating at the frequency of the carrier of the received signal, and the RF input of the receiver circuit, and in particular the LNA disposed at the input to said circuit. In addition, since the local oscillator operates at the same frequency as the input signal, interference and interaction take place between them.

A known method of solving the problem of leakage currents consists in using a local oscillator producing a signal at a frequency that is different from that of the input signal, and that is subsequently modified to produce a signal at the same frequency as that of the input signal. It is possible to use two local oscillators respectively producing two frequencies $F_1$ and $F_2$ that are different and that are applied to a simple mixer which produces two respective signals at frequencies $F_1+F_2$ and $F_1-F_2$, with $F_1$ and $F_2$ being selected in such a manner that one of the frequencies obtained at the output from the simple mixer corresponds to the frequency of the received signal. It is then necessary to filter out the other frequency delivered by the simple mixer, which means that $F_2$ must be sufficiently large relative to $F_1$. It also turns out that such filtering likewise leads to problems of interference and leakage with the received signal.

To solve that problem, the concept of a mixer circuit with image rejection as shown in FIG. 3 has been proposed, said circuit using two local oscillators, e.g. of the voltage controlled oscillator (VCO) type, delivering two respective frequencies $F_1$ and $F_2$. The outputs of the oscillators are connected respectively to two quadrature phase dividers each producing two signals in phase quadrature, the same-phase signals having at the outputs from the phase dividers being applied to respective simple mixers 23, 24 whose outputs are applied to an adder or subtracter circuit 25 delivering an output signal of frequency $F_o$ equal to $F_1-F_2$ or to $F_1+F_2$, with $F_1$ and $F_2$ being selected in such a manner that $F_o$ corresponds to the frequency of the received signal. Nevertheless, such a circuit depends on the precision of the phase dividers. If they are not perfect, then the circuit also delivers in attenuated form the other frequency, i.e. $F_1-F_2$ if $F_o=F_1+F_2$ or $F_1+F_2$ if $F_o=F_1-F_2$.

Those circuits also present the drawback of requiring two local oscillators.

In order to eliminate one of the two local oscillators, proposals have also been made for the concept of a mixer circuit with frequency regeneration. As shown in FIG. 4, such a circuit comprises a frequency divider 27 receiving at its input the output signal $F_o$ from the circuit, and a simple mixer 26 receiving as inputs the input signals $F_i$ to the circuit and the output from the frequency divider 27. Because of the presence of the simple mixer 26, the following relationship applies:

$$F_o = F_i (+\text{and} -) \frac{F_o}{Div} \qquad (1)$$

where Div is the division ratio of the frequency divider 27.

The output signal from the circuit thus comprises two frequencies $F_o$ as follows:

$$\frac{F_i}{\left(1+\frac{1}{Div}\right)} \text{ and } \frac{F_i}{\left(1-\frac{1}{Div}\right)} \qquad (2)$$

In order to eliminate one of those two frequencies, it is thus still necessary to use a lowpass filter 28 (FIG. 5) in order to eliminate the lower frequency, which assumes that the two frequencies obtained prior to filtering are very far apart from each other, and thus that the division ratio Div is large. Because of the presence of such a filter, that circuit also presents the above-mentioned drawbacks due to interference and interaction taking place with the input signal.

Solutions have also been proposed that make use of digital frequency dividers. Nevertheless, those solutions are poorly adapted to generating sinewave carriers.

An object of the present invention is to eliminate those drawbacks. This object is achieved by providing a mixer circuit with image frequency rejection, the mixer circuit comprising a quadrature phase divider presenting an input connected to the input of the mixer circuit, and two outputs respectively delivering two signals in phase quadrature which are applied respectively to two simple mixers, the circuit being characterized in that it comprises a quadrature phase and frequency divider having a frequency division ratio and presenting two inputs respectively connected to the respective outputs of the two simple mixers and a first output delivering a first output signal of the mixer circuit, which signal is applied to the inputs of the two simple mixers.

Advantageously, the quadrature phase and frequency divider delivers on two other outputs two signals in phase quadrature presenting a frequency equal to the frequency of the signal delivered by the first output as divided by the frequency division ratio.

According to a feature of the invention, the signal from the first output of the mixer circuit presents a frequency equal to:

$$F_o = F_i - \frac{F_o}{Div}$$

$F_i$ being the frequency of the input signal of the mixer circuit, and Div being the frequency division ratio of the phase and frequency divider.

Preferably, in order to be integrated in an integrated circuit, all of its circuits are made symmetrical so as to process two identical signals of opposite polarities in parallel.

According to another feature of the invention, it further comprises a quadrature phase divider interposed on its first output in order to obtain two signals at the same frequency and in phase quadrature.

According to another feature of the invention, the frequency division ratio is an integer.

The invention also provides an RF receiver of zero or quasi-zero intermediate frequency, the receiver comprising an amplifier connected to a receive antenna via a bandpass filter, the signal received by the antenna being applied, after amplification, to a mixer circuit for converting the amplified input signal to baseband, said mixer circuit being connected to a local oscillator and delivering two baseband signals in quadrature (phase offset of 90°), which signals are filtered and then applied to a demodulator, the RF receiver being characterized in that the mixer circuit comprises a mixer circuit of the image frequency rejection type comprising a quadrature phase divider having an input connected to the local oscillator and two outputs respectively delivering two signals in phase quadrature which are applied respectively to two simple mixers, a quadrature phase and frequency divider having a frequency division ratio and presenting two inputs respectively connected to the respective outputs of the two simple mixers, and a first output delivering a first output signal which is applied to the inputs of the two simple mixers, the first output signal being mixed with the received and amplified signal by the two simple mixers.

Advantageously, the quadrature phase and frequency divider delivers on two other outputs two signals in phase quadrature presenting a frequency equal to the frequency of the signal delivered by the first output divided by the frequency division ratio.

According to a feature of the invention, the RF receiver further comprises a quadrature phase divider interposed on the first output of the image frequency rejection mixer circuit in order to obtain two signals at the same frequency and in phase quadrature.

According to another feature of the invention, the RF receiver includes switch means for applying respectively to the simple mixers with the received and amplified signal, either the phase quadrature signals from the first output of the image frequency rejection mixer circuit, or the phase quadrature signals from the second output thereof.

Preferably, and in order to be suitable for receiving GSM and DCS 1800 signals, the local oscillator of the voltage-controlled oscillator type delivers a frequency of about 2.7 GHz and the division ratio of the quadrature phase and frequency divider is selected to be equal to 2.

A preferred embodiment of the circuit of the invention is described below by way of non-limiting example and with reference to the accompanying drawings, in which.

Figure 1:
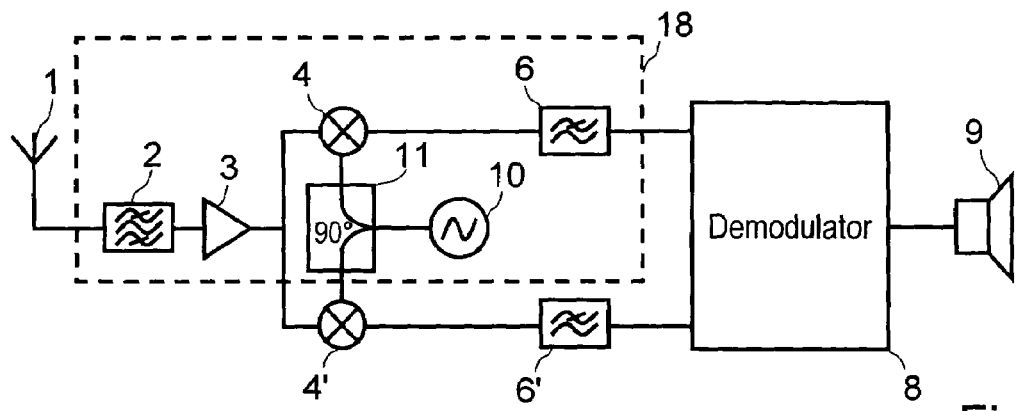
FIG. 1 is a diagram of a prior art RF receiver of zero intermediate frequency.

The RF receiver with zero or quasi-zero intermediate frequency shown in FIG. 1 comprises, in conventional manner, a bandpass filter 2 connected to a receive antenna 1, a broadband low-noise amplifier 3 connected to the output of the bandpass filter 2, and two simple mixers 4, 4' to which the output signal from the amplifier is applied. These mixers also receive as input a signal coming from a local oscillator, e.g. of the VCO type (Voltage Controlled Oscillator), via a quadrature phase divider 11 which applies two signals to the respective mixers 4, 4' at the frequency of the oscillator but with a phase offset of 90° relative to each other. In an architecture with zero intermediate frequency, the frequency of the local oscillator is selected to be equal to the frequency of the carrier of the signal to be received.

The respective outputs from the two simple mixers 4, 4' are applied to two respective lowpass filters 6, 6' whose outputs are connected to a baseband demodulator 8.

For a mobile telephone, the output signal from the demodulator is applied to the loudspeaker 9 of the telephone to deliver the transmitted sound signal as received by the telephone.

Figure 2:
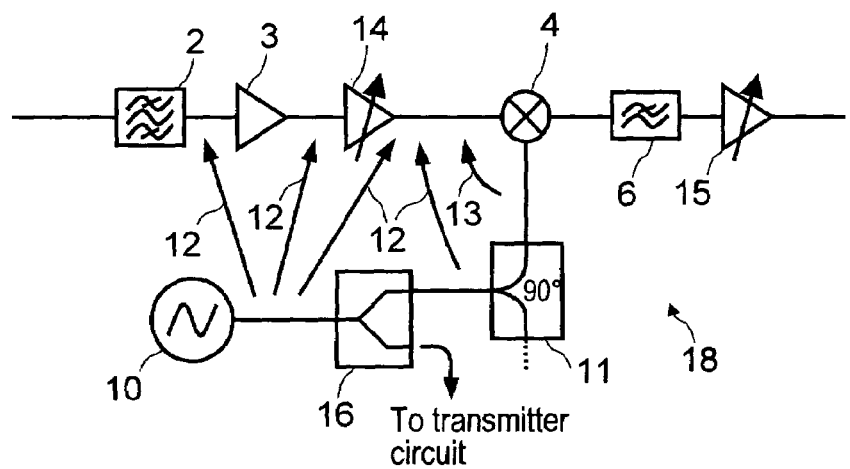
FIG. 2 shows a portion of the receiver shown in FIG. 1 in greater detail.
Figure 3:
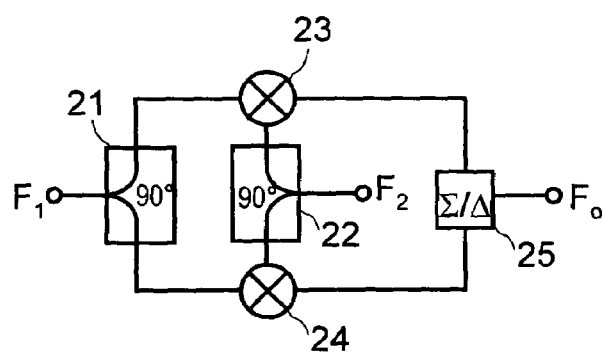
FIG. 3 is a diagram of a prior art mixer circuit with image frequency rejection.
Figure 4:
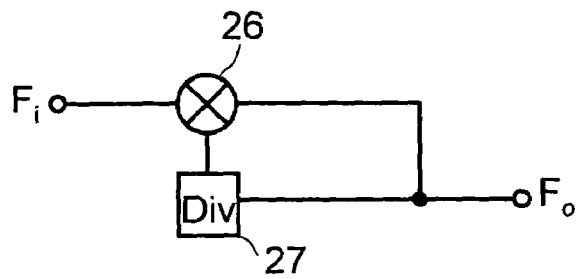
FIGS. 4 and 5 are diagrams of prior art mixer circuits with frequency regeneration.
Figure 5:
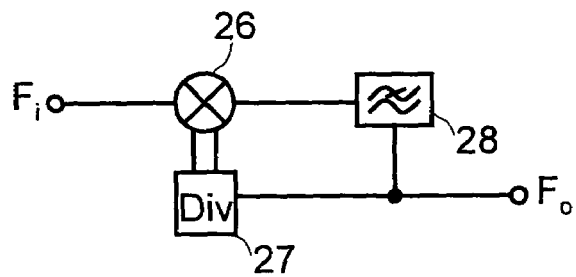

As shown in greater detail on FIG. 2 which shows a portion 18 of the receiver shown in FIG. 1, each mixer 4, 4' is preceded by an adjustable gain amplifier 14 operating in the RF frequency range, and the bandpass filter 6, 6' is followed by another adjustable gain amplifier 15 operating in the baseband frequency range.

Furthermore, a signal splitting circuit 16 is interposed between the local oscillator 10 and the phase divider 11 so as to make it possible to use the signal from the local oscillator in other circuits, such as the transmitter circuit in a mobile telephone.

In such an architecture, it turns out that coupling occurs, and thus that leakage currents flow between the local oscillator 10 and a portion of the circuit situated between the input of the amplifier 3 and the input of each mixer 4, 4', together with leakage between the splitter 16 and the frequency divider 11, and leakage between the portion of the circuit situated between the amplifiers 14 and the mixers 4, 4' (arrows 12 and 13). Since the frequency of the local oscillator 10 is identical to that of the signal to be received, this coupling leads to a DC voltage offset at the outputs from the mixers 4, 4'. Consequently, between two received signal pulse trains, the voltage level of the input signal can change, thereby leading to an adjustment in the gain of the amplifiers 14, 15 and thus to a DC voltage shift.

It is known to reduce this DC voltage shift with the baseband demodulator 8, which needs to determine this DC voltage level between each pulse train of the received signal, and to wait for locking of the local oscillator and stabilization of the DC voltage level in the branches of the circuits that operate in baseband.

In addition, in order to reduce these coupling phenomena, proposals have also been made to isolate the local oscillator and the splitter circuit 16 from the remainder of the circuit, or indeed to double the frequency of the local oscillator.

Nevertheless, those solutions do not enable all of the coupling phenomena to be eliminated. In addition, they contribute to significantly increasing the complexity, the size, the electricity consumption, and the cost of such a circuit. Furthermore, in the last of those envisaged solutions, not only are coupling and interference phenomena not eliminated since the local oscillator interferes with the second harmonic of the received signal, but in addition it is not easy to double the frequency of the local oscillator when the signal to be received is already at a high frequency. In DCS 1800 systems, it would be necessary to use a local oscillator at 3.6 GHz.

Figure 6:
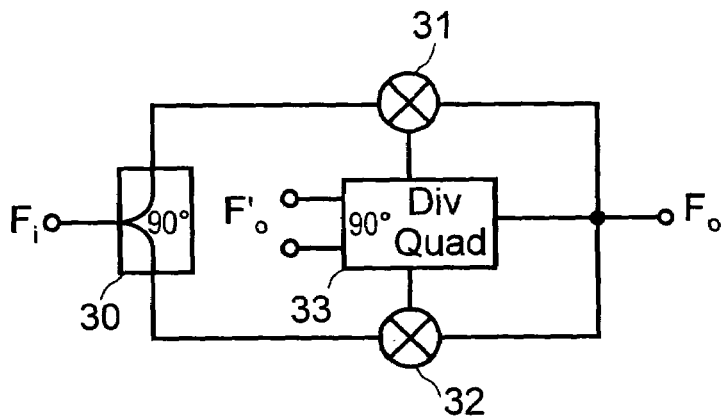
FIGS. 6 and 7 show mixer circuits of the invention with frequency rejection.

In order to reduce coupling currents in such a circuit simply and to a great extent, the invention proposes the circuit shown in FIG. 6, which implements the function of a mixer with image frequency rejection. The circuit comprises a quadrature phase divider 30 to which the input signal of the circuit is applied, said signal having a frequency $F_i$, and being constituted in particular by the signal from the local oscillator 10. The outputs with a 90° phase offset from the phase divider 30 are applied respectively to two simple mixers 31 and 32, while the other inputs of these simple mixers receive the output signal from the circuit at the frequency $F_o$. This circuit also has a quadrature phase and frequency divider 33 with two inputs connected to the respective outputs of the two simple mixers 31, 32.

The divider 33 also presents an output delivering two signals in phase quadrature at the same frequency $F'_o$ equal to the frequency of the output signal $F_o$ divided by the division ratio Div of the divider 33. The following relationship applies in this circuit:

$$F_o = F_i - \frac{F_o}{Div} \quad (3)$$

This relationship enables the following values to be deduced for $F_o$ and $F'_o$:

$$F_o = \frac{F_i}{\left(1 + \frac{1}{Div}\right)} = F_i \frac{Div}{Div+1} \text{ and } F'_o = \frac{F_o}{Div} = -\frac{F_i}{(Div+1)} \quad (4)$$

It is found that this circuit is well adapted to receiving GSM and DCS 1800 signals. For this purpose, it suffices to select a division ratio Div for the divider 33 that is equal to 2 and a local oscillator frequency 10 that is equal to about 2.7 GHz, thus enabling values of $F_o$ and $F'_o$ to be obtained that are respectively close to 900 MHz and 1800 MHz.

For the 802.11b, Bluetooth, and DECT standards, a local oscillator can be used, for example, producing a frequency substantially equal to 3.6 GHz together with a division ratio equal to 2 so as to obtain an output frequency $F'_o$ close to 2.4 GHz. Since the frequency 2.4 GHz is in very widespread use, the fact of using a local oscillator having a different frequency selected from a band that is less occupied helps avoid the local oscillator being disturbed.

This solution also makes it possible to reduce coupling phenomena significantly, since it is only the third harmonic of the received signal which interferes with the local oscillator. In particular, this solution enables the coupling represented by arrows 12 in FIG. 2 to be eliminated.

Figure 7:
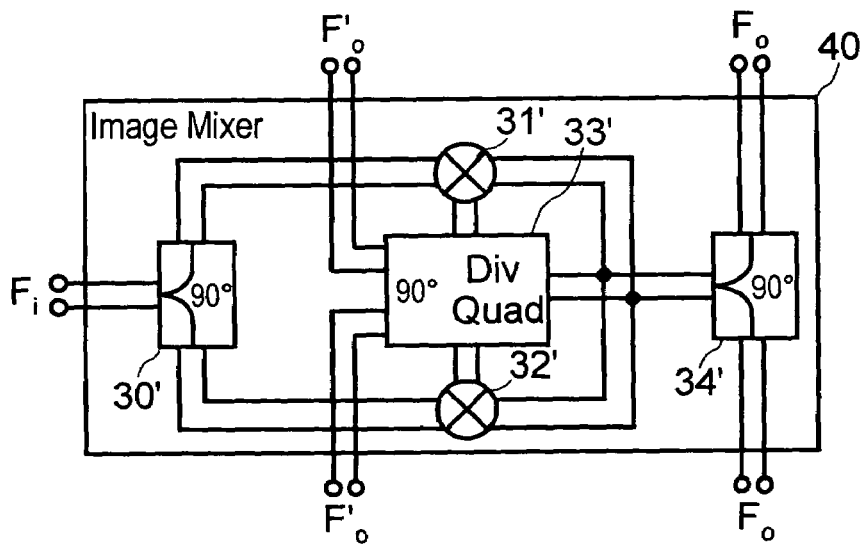

Furthermore, this solution is well adapted to making an integrated receiver circuit. In order to avoid the phenomena which occur in circuits when the level of integration is high, the circuits are made to be symmetrical, i.e. they are duplicated so as to process the same signals but with opposite polarities. The circuit shown in FIG. 7 represents an architecture analogous to that of FIG. 6, except for the fact that all of the connections between the components of the circuit are duplicated, and the components 30 to 33 of the circuit are replaced by components 30' to 33' that perform the same functions on signals of opposite polarities. In addition, in order to have an output signal of frequency $F_o$ with two phases in quadrature, the circuit further comprises a quadrature phase divider 34' to which the signal of frequency $F_o$ is applied.

Figure 8:
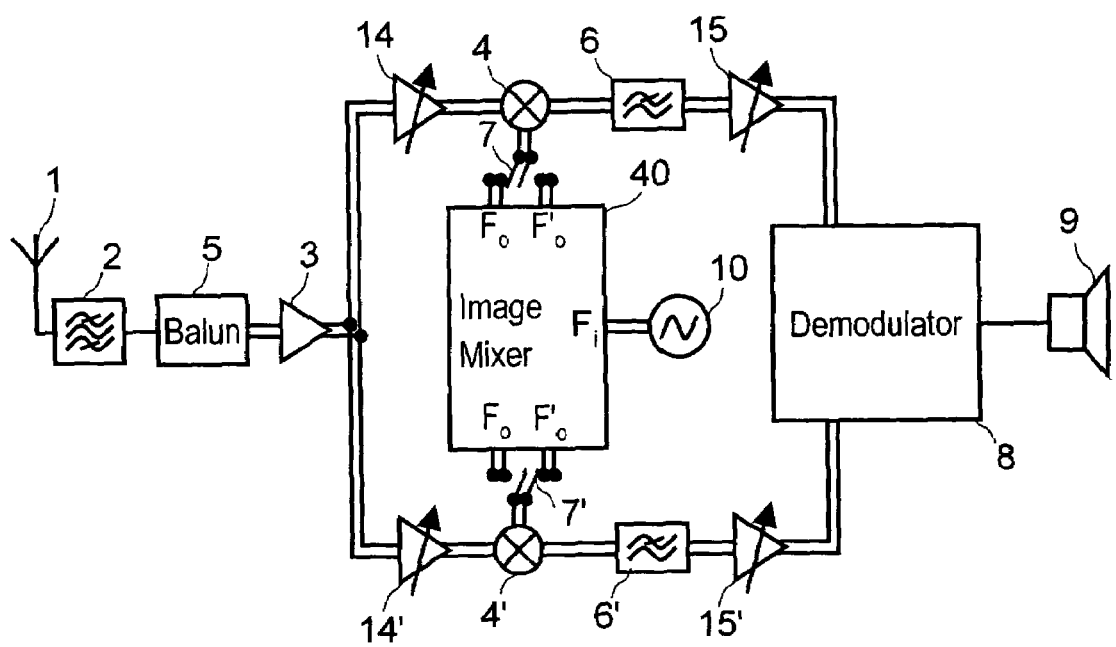
FIG. 8 is a diagram of an RF receiver of the invention with zero intermediate frequency, in which the circuit shown in FIG. 7 is integrated.

FIG. 8 shows an integrated RF receiver with zero or quasi-zero intermediate frequency, in accordance with the invention. This receiver corresponds to the receiver shown in FIGS. 1 and 2, in which the phase divider 11 has been replaced by the circuit shown in FIG. 7. Elements which appear both in this figure and in FIG. 1 or FIG. 2 are therefore given the same reference numerals.

In addition, the receiver may include a balun 5 for generating two identical signals but of opposite polarities, which are applied to the remainder of the circuit which is made symmetrical so as to be suitable for integration in an integrated circuit.

The receiver may also have two switches 7, 7' placed respectively between the outputs of the mixer 40 and the respective inputs of the two simple mixers 4 and 4', enabling the frequency $F'_o$ (GSM mode in the application to mobile telephony as mentioned above) or the frequency $F_o$ (DCS 1800 mode) to be selected.

The invention claimed is:

1. A mixer circuit with image frequency rejection, the mixer circuit comprising a quadrature phase divider (30, 30') presenting an input connected to the input ($F_i$) of the mixer circuit, and two outputs respectively delivering two signals in phase quadrature which are applied respectively to two simple mixers (31, 32; 31', 32'), the circuit being characterized in that it comprises a quadrature phase and frequency divider (33, 33') having a frequency division ratio and presenting two inputs respectively connected to the respective outputs of the two simple mixers (31, 32; 31', 32') and a first output delivering a first output signal ($F_o$) of the mixer circuit, which signal is applied to the inputs of the two simple mixers.

2. A mixer circuit according to claim 1, characterized in that the quadrature phase and frequency divider (33, 33') delivers on two other outputs two signals in phase quadrature ($F'_o$) presenting a frequency equal to the frequency of the signal ($F_o$) delivered by the first output as divided by the frequency division ratio.

3. A mixer circuit according to claim 1, characterized in that the signal ($F_o$) from the first output of the mixer circuit presents a frequency equal to:

$$F_o = F_i - \frac{F_o}{Div}$$

$F_i$ being the frequency of the input signal of the mixer circuit, and Div being the frequency division ratio of the phase and frequency divider (33, 33').

4. A mixer circuit according to claim 1, characterized in that in order to be integrated in an integrated circuit, all of its circuits are made symmetrical so as to process two identical signals of opposite polarities in parallel.

5. A mixer circuit according to claim 1, characterized in that it further comprises a quadrature phase divider (34') interposed on its first output ($F_o$) in order to obtain two signals at the same frequency and in phase quadrature.

6. A mixer circuit according to claim 1, characterized in that the frequency division ratio is an integer.

7. An RF receiver of zero or quasi-zero intermediate frequency, the receiver comprising an amplifier (3) connected to a receive antenna (1) via a bandpass filter (2), the signal received by the antenna being applied, after amplification, to a mixer circuit for converting the amplified input signal to baseband, said mixer circuit being connected to a local oscillator (10) and delivering two baseband signals in quadrature (phase offset of 90°), which signals are filtered and then applied to a demodulator (8), the RF receiver being characterized in that the mixer circuit comprises a mixer circuit (40) of the image frequency rejection type comprising a quadrature phase divider (30') having an input ($F_i$) connected to the local oscillator (10) and two outputs respectively delivering two signals in phase quadrature which are applied respectively to two simple mixers (31', 32'), a quadrature phase and frequency divider (33') having a frequency division ratio and presenting two inputs respectively connected to the respective outputs of the two simple mixers (31', 32'), and a first output delivering a first output signal ($F_o$) which is applied to the inputs of the two simple mixers (31', 32'), the first output signal ($F_o$) being mixed with the received and amplified signal by the two simple mixers (4, 4').

8. An RF receiver according to claim 7, characterized in that the quadrature phase and frequency divider (33') delivers on two other outputs two signals in phase quadrature ($F'_o$) presenting a frequency equal to the frequency of the signal ($F_o$) delivered by the first output divided by the frequency division ratio.

9. An RF receiver according to claim 7, characterized in that the first output signal ($F_o$) of the mixer circuit (40) presents a frequency equal to:

$$F_o = F_i - \frac{F_o}{Div}$$

$F_i$ being the frequency of the input signal of the mixer circuit, and Div being the frequency division ratio of the phase and frequency divider.

10. An RF receiver according to claim 7, characterized in that it further comprises a quadrature phase divider (34') interposed on the first output ($F_o$) of the image frequency rejection mixer circuit (40) in order to obtain two signals at the same frequency and in phase quadrature.

11. An RF receiver according to claim 10, characterized in that it includes switch means (7, 7') for applying respectively to the simple mixers (4, 4') with the received and amplified signal, either the phase quadrature signals ($F_o$) from the first output of the image frequency rejection mixer circuit (40), or the phase quadrature signals ($F'_o$) from the second output thereof.

12. An RF receiver according to claim 7, characterized in that in order to be suitable for receiving GSM and DCS 1800 signals, the local oscillator (10) of the voltage-controlled oscillator type delivers a frequency of about 2.7 GHz and the division ratio of the quadrature phase and frequency divider (33') is selected to be equal to 2.

13. An RF receiver according to claim 7, characterized in that the local oscillator (10) of the voltage-controlled oscillator type delivers a frequency of about 3.6 GHz, and the division ratio of the quadrature phase and frequency divider (33') is selected to be equal to 2 so as to obtain an output frequency close to 2.4 GHz.

* * * * *